(12) United States Patent
Dutton

(10) Patent No.: US 12,211,881 B2
(45) Date of Patent: *Jan. 28, 2025

(54) PIXEL CIRCUIT AND METHOD OF OPERATING THE SAME IN AN ALWAYS-ON MODE

(71) Applicant: STMICROELECTRONICS (RESEARCH & DEVELOPMENT) LIMITED, Marlow (GB)

(72) Inventor: Neale Dutton, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 34 days.

This patent is subject to a terminal disclaimer.

(21) Appl. No.: 18/170,270

(22) Filed: Feb. 16, 2023

(65) Prior Publication Data

US 2023/0197759 A1    Jun. 22, 2023

Related U.S. Application Data

(60) Continuation of application No. 17/036,357, filed on Sep. 29, 2020, now Pat. No. 11,626,446, which is a division of application No. 16/108,417, filed on Aug. 22, 2018, now Pat. No. 10,818,721.

(51) Int. Cl.
| | |
|---|---|
| *H01L 31/02* | (2006.01) |
| *G06T 7/579* | (2017.01) |
| *H01L 25/16* | (2023.01) |
| *H01L 27/146* | (2006.01) |
| *H04N 25/77* | (2023.01) |

(52) U.S. Cl.
CPC ........ *H01L 27/14643* (2013.01); *G06T 7/579* (2017.01); *H01L 25/167* (2013.01); *H01L 31/02027* (2013.01); *H04N 25/77* (2023.01); *G06T 2207/10028* (2013.01)

(58) Field of Classification Search
CPC ............. H01L 27/14643; H01L 25/167; H01L 31/02027
See application file for complete search history.

(56) References Cited

U.S. PATENT DOCUMENTS

| | | | |
|---|---|---|---|
| 9,094,661 B2 | 7/2015 | Venkataraman et al. | |
| 9,519,972 B2 | 12/2016 | Venkataraman et al. | |
| 9,730,649 B1* | 8/2017 | Jepsen ................... | A61B 5/745 |
| 9,952,323 B2 | 4/2018 | Deane | |
| 10,818,721 B2* | 10/2020 | Dutton .................. | H01L 25/167 |
| 11,323,689 B2* | 5/2022 | Okuzawa .......... | H01L 27/14643 |
| 11,428,792 B2 | 8/2022 | Dutton et al. | |

(Continued)

*Primary Examiner* — Dale E Page
*Assistant Examiner* — Wilner Jean Baptiste
(74) *Attorney, Agent, or Firm* — Slater Matsil, LLP

(57) ABSTRACT

An imaging device includes a sensor array with a number of pixels. In an embodiment, the imaging device can be operated by capturing a first low-spatial resolution frame using a subset of pixels of the sensor array and then capturing a second low-spatial resolution frame using the same subset of pixels of the sensor array. A first depth map is generated using raw pixel values of the first low-spatial resolution frame and a second depth map is generated using raw pixel values of the second low-spatial resolution frame. The first depth map can be compared to the second depth map to determine whether an object has moved in a field of view of the imaging device.

21 Claims, 13 Drawing Sheets

(56) References Cited

U.S. PATENT DOCUMENTS

2017/0052065 A1 2/2017 Sharma et al.
2017/0184704 A1 6/2017 Yang et al.
2018/0268522 A1 9/2018 Hawkins et al.

* cited by examiner

PIXEL CIRCUIT AND METHOD OF OPERATING THE SAME IN AN ALWAYS-ON MODE

CROSS-REFERENCE TO RELATED APPLICATION

This application is a continuation of U.S. patent application Ser. No. 17/036,357, filed on Sep. 29, 2020, which is a divisional of U.S. patent application Ser. No. 16/108,417, filed on Aug. 22, 2018, now U.S. Pat. No. 10,818,721, which issued on Oct. 27, 2020, which applications are hereby incorporated herein by reference.

TECHNICAL FIELD

The present disclosure relates generally to electronic circuits, and, in particular embodiments, to a pixel circuit and a method of operating the same in an always-on mode.

BACKGROUND

Image sensors having photo-sensitive elements (e.g. pixels) may be implemented using single-photon avalanche diodes or charge-domain pixels. In either case, such image sensors may have associated image processing circuitry embodied in a single chip. Such image sensors may be incorporated into devices (e.g. tablets, mobile phones, cameras) and may be used to determine a variety of parameters. Examples of such parameters include determining whether an object is located within a field-of-view of the image sensor, reconstructing an image of an object located within the field of view of the image sensor, determining a distance between the image sensor and an object, detecting and/or classifying motion that occurs within the field of view of the image sensor, determining a gesture performed within the field of view of the image sensor, and identifying features (e.g. facial features) located within the field of view of the image sensor. These parameters may be determined during an always-on operating mode where the image sensor continuously scans and/or monitors its field of view. Such an always-on operating mode may cause the image sensor to consume high power.

SUMMARY

An embodiment method of operating an imaging device including a sensor array including a plurality of pixels, includes: capturing a first low-spatial resolution frame using a subset of the plurality of pixels of the sensor array; generating, using a processor coupled to the sensor array, a first depth map using raw pixel values of the first low-spatial resolution frame; capturing a second low-spatial resolution frame using the subset of the plurality of pixels of the sensor array; generating, using the processor, a second depth map using raw pixel values of the second low-spatial resolution frame; and determining whether an object has moved in a field of view of the imaging device based on a comparison of the first depth map to the second depth map.

An embodiment imaging device includes: a sensor array including an array of pixels; a row driver circuit coupled to the array of pixels and configured to select at least one row of the array of pixels; a column driver circuit coupled to the array of pixels and configured to select at least one column of the array of pixels; and a controller coupled to the row driver circuit and the column driver circuit. The controller is configured to: provide a first timing signal to the row driver circuit and the column driver circuit to select a subset of the array of pixels to capture a first low-spatial resolution frame; and provide a second timing signal to the row driver circuit and the column driver circuit to select the subset of the array of pixels to capture a second low-spatial resolution frame. The embodiment imaging device further includes a processor coupled to receive an output of the array of pixels. The processor is configured to: generate a first depth map using raw pixel values of the first low-spatial resolution frame; generate a second depth map using raw pixel values of the second low-spatial resolution frame; and determine whether an object has moved in a field of view of the imaging device based on a comparison of the first depth map to the second depth map.

An embodiment device includes: a processor; and a non-transitory computer-readable storage medium storing a program to be executed by the processor. The program includes instructions for: capturing a first low-spatial resolution frame using a subset of a plurality of pixels of a sensor array; generating, using a processor coupled to the sensor array, a first depth map using raw pixel values of the first low-spatial resolution frame; capturing a second low-spatial resolution frame using the subset of the plurality of pixels of the sensor array; generating, using the processor, a second depth map using raw pixel values of the second low-spatial resolution frame; and determining whether an object has moved in a field of view of the device based on a comparison of the first depth map to the second depth map.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various embodiments described herein provide a pixel circuit and a method of operating the same in an always-on mode. The circuit and method of operating the same provide a way to decrease overall power consumption of the pixel circuit.

Figure 1:
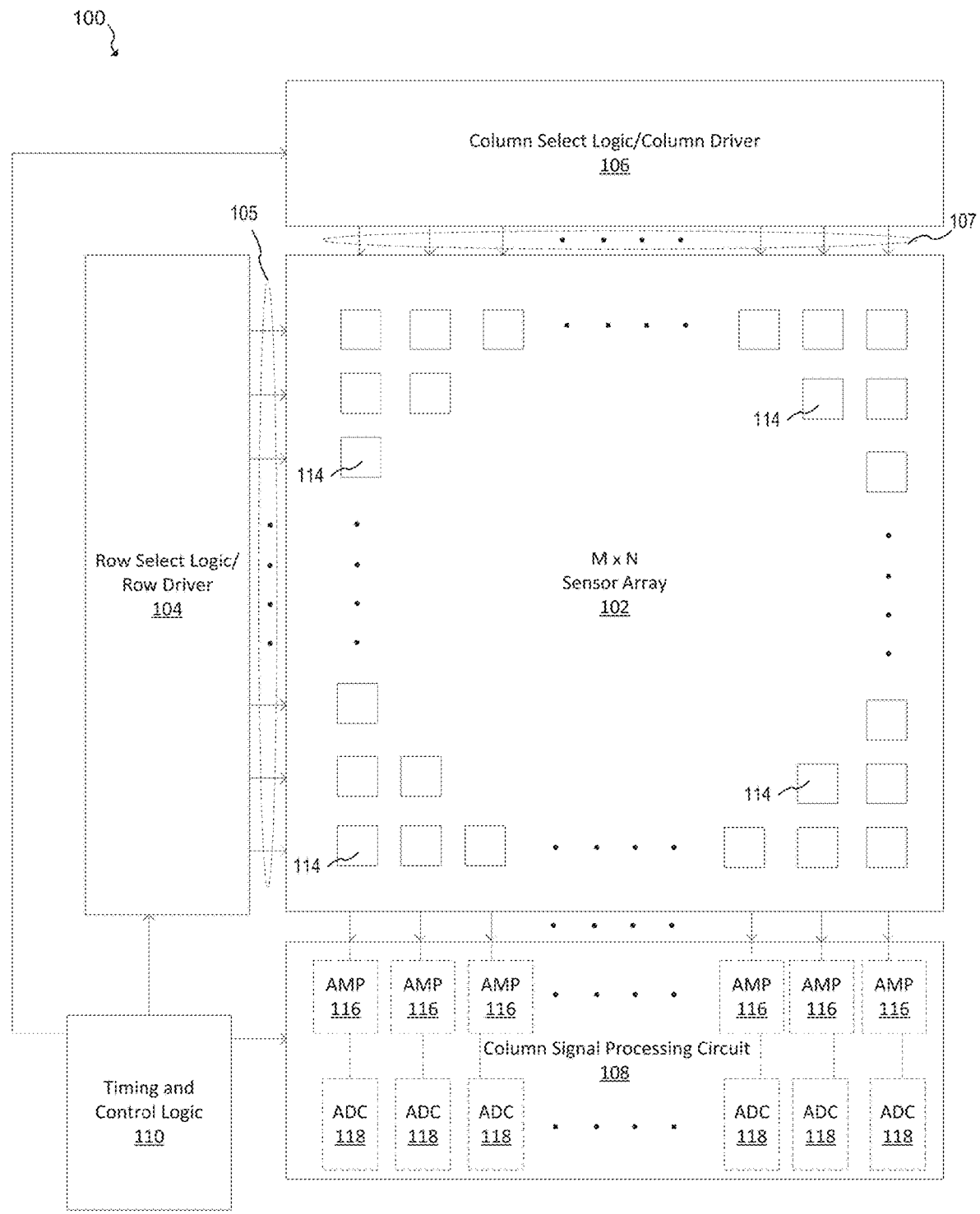
FIG. 1 shows a block diagram of an imaging device, in accordance with some embodiments.

FIG. 1 shows a block diagram of an imaging device 100, in accordance with an embodiment. In some embodiments, the imaging device 100 may be a digital imaging device (e.g. a camera, such as a time-of-flight camera). The imaging device boo captures light photons and converts the photons to electrical current, voltage, and/or charge that is subsequently processed by circuitry included in or coupled to the imaging device 100. The signal is processed for at least one of the following purposes: (1) determining whether an object is located within a field-of-view of the imaging device 102; (2) reconstructing an image of an object located within the field of view of the imaging device 100; (3) determining a distance between the imaging device 100 and an object located within the field of view of the imaging device 100; (4) detecting and/or classifying motion that occurs within the field of view of the imaging device 100; (5) determining a gesture performed within the field of view of the imaging device 100; or (6) identifying features (e.g. facial features) located within the field of view of the imaging device 100.

As shown in FIG. 1, the imaging device 100 may include a sensor array 102, row select logic 104 (also referred to as a row driver circuit in FIG. 1), column select logic 106 (also referred to as a column driver circuit in FIG. 1), a column signal processing circuit 108, and timing and control logic 110. The sensor array 102 is sensitive to optical radiation (e.g., electromagnetic radiation in the visible, infrared, and ultraviolet ranges) and includes a plurality of pixels 114 arranged as a matrix of M rows and N columns, where M and N are whole numbers greater than 1. Each pixel 114 of the sensor array 102 may be referred to as a photo-sensitive pixel. Each pixel 114 may be implemented, for example, using a single-photon avalanche diode (SPAD), a fast photodiode, a photo-gate, a current assist photo demodulator (CAPD), or a lock-in photo demodulator. It is noted that these implementations of the pixel 114 are merely examples; the pixel 114 may be implemented by other circuits known in the art. Each pixel 114 includes a photo-sensitive element and associated readout and reset circuitries that are coupled communicatively and in use to the photo-sensitive element. Various implementations of the pixel 114 and methods of operation thereof are shown and described in more detail below in FIGS. 2-6, 7A-7B, and 8A-8B.

Row select logic 104 includes circuitry that allows one or more rows of the M rows of pixels 114 to be selected and/or activated at one time. The row select logic 104 may select or activate the one or more rows of the M rows of pixels 114 using row select signals 105 provided to the sensor array 102. Column select logic 106 includes circuitry that allows one or more columns of the N columns of pixels 114 to be selected and/or activated at one time. The column select logic 106 may select or activate the one or more columns of the N columns of pixels 114 using column select signals 107 provided to the sensor array 102. The column select signals 107 may be clock signals having different phases, where each of the multiple clocks is a delayed replica (i.e., different phase) of a phased locked loop (PLL) clock. In some embodiments, at least one of the row select logic 104 or the column select logic 106 may be implemented by circuitry known in the art, an example being a clock generator and a shift register.

Each column of the N columns of pixels 114 in the sensor array 102 may have respective column sensing circuitry associated with the column of pixels 114. In other words, all M pixels 114 of a given column of pixels 114 may be coupled communicatively and in use to a respective column sensing circuitry. In some embodiments, the column sensing circuitry of a given column of pixels 114 may be included in the column signal processing circuit 108. The column sensing circuitry may include circuitry for reset and readout of accumulated charge contained within each pixel 114 of a respective column of pixels 114. In an implementation, each pixel 114 of a respective column of pixels 114 may use the same electronics that perform the functions of reset and readout. In other words, each pixel 114 of a respective column of pixels 114 may share the same circuit for reset and readout. In some embodiments, the column sensing circuitry of column signal processing circuit 108 may be implemented by circuitry known in the art, an example being a network of transistors coupled to each pixel 114 of a respective column of pixels 114.

Timing and control logic 110 controls the timing of the row select logic 104, column select logic 106, and the selection of the column signal processing circuit 108 to allow for the exposure, reset, and readout of each pixel 114 of sensor array 102. For example, in an implementation, photons are captured by all pixels 114 of sensor array 102 simultaneously (i.e. the integration of photons in the photo-sensitive element of each pixel 114 of the sensor array 102 starts and stops at the same time). In such embodiments, the timing and control logic 110 provides control signals to the row select logic 104 and the column select logic 106 to allow for the simultaneous exposure of all pixels 114 of sensor array 102. Following the exposure of all pixels 114, the signal generated by each pixel 114 is read out.

In some embodiments, the imaging device 100 may include a respective amplifier 116 for each column of pixels 114 of the sensor array 102. The respective amplifier 116 may be configured to amplify the electrical signal read out from a pixel 114 of a respective column of pixels 114. The amplifiers 116 for each of the N columns may be included in the column signal processing circuit 108, as in the example of FIG. 1. Additionally, the imaging device 100 may include a respective analog-to-digital convertor (ADC) 118 for each column of pixels 114 of the sensor array 102. In such embodiments, the ADCs 118 for each of the N columns may be included in the column signal processing circuit 108, as in the example of FIG. 1. Each pixel 114 of the sensor array 102 (e.g. time-of-flight (TOF) sensor array) may be implemented, for example, as an SPAD or a charge-domain pixel (e.g. a fast photodiode, a photo-gate, a CAPD, or a lock-in photo demodulator. Each of these implementations is described in the following examples.

Figure 2:
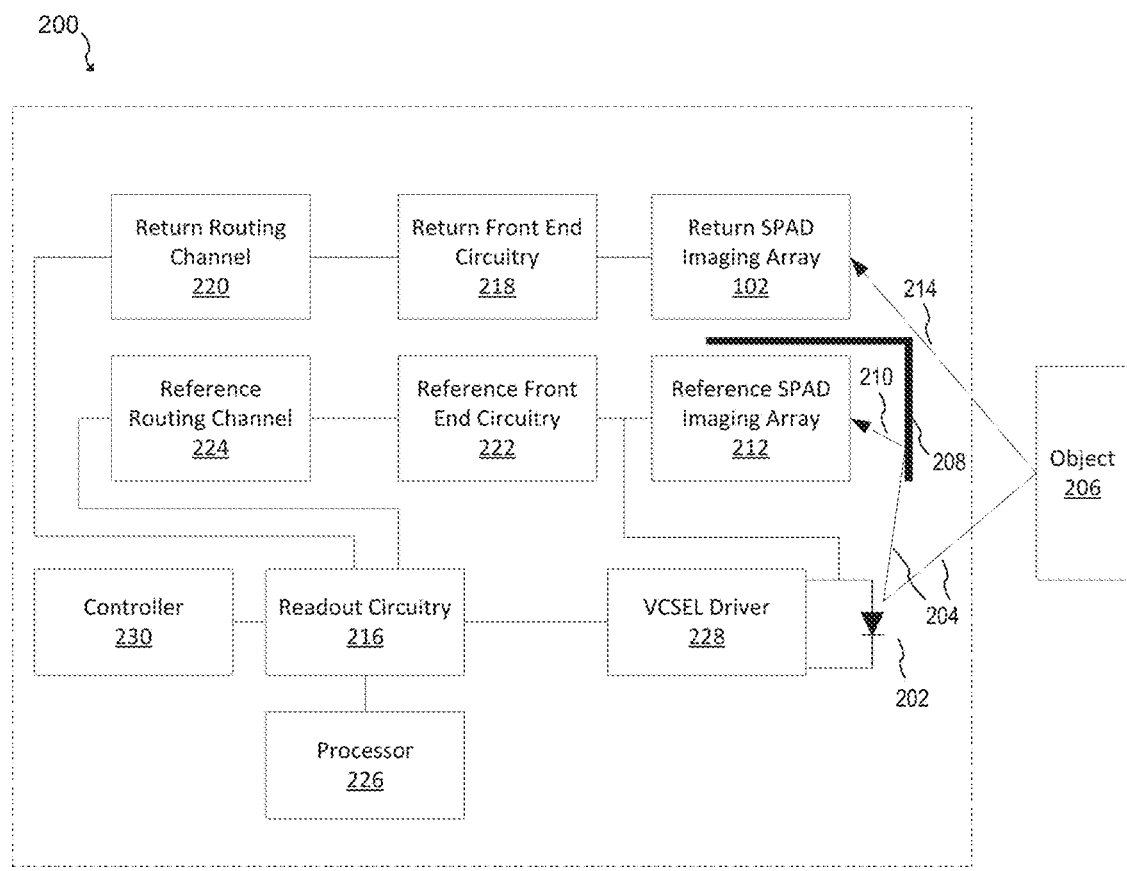
FIG. 2 shows an imaging system that includes an optical barrier and a sensor array implemented as a return single-photon avalanche diode (SPAD) imaging array, in accordance with an embodiment.

FIG. 2 shows an imaging system 200 that includes the sensor array 102 implemented as a return SPAD imaging array, in accordance with an embodiment. In such an embodiment, each pixel 114 of the sensor array 102 is implemented using at least one SPAD. The imaging system 200 includes a light-emitting device 202 for generating and transmitting an optical pulse 204 (e.g., electromagnetic radiation in the visible, infrared, and ultraviolet ranges) into a field of view or image scene that may contain an object 206. In some embodiments, optics (e.g. a lens, not shown in FIG. 2) may be disposed over the light-emitting device 202 in order to focus or direct the optical pulse 204 into the field of view of the imaging system 200. The light-emitting device 202 may be, for example, a vertical cavity surface emitting laser (VCSEL) or a light-emitting emitting diode (LED). Other exemplary light-emitting devices 202 may be used in other embodiments.

The imaging system 200 further includes a driver 228 (which may be a VCSEL driver, as shown in the example FIG. 2) that generates a driving signal for driving the light-emitting device 202 (which may be a VCSEL, as shown in the example FIG. 2), e.g., for controlling the generation and output of the optical pulse 204 by the light-emitting device 202. The driver 228, which may be identified with the timing and control logic 110 shown in FIG. 1, is controlled by a controller 230, which provides a control signal (e.g., a synthesized digital pulse) to the driver 228. The driver 228, in response to reception of the control signal, generates and provides the driving signal to the light-emitting device 202 for driving the output optical pulse 204. The controller 230 may provide the control signal to the driver 228 through the readout circuitry 216, as shown in FIG. 2.

The imaging system 200 includes an optical barrier 208, which reflects a first portion 210 (which may be referred to herein as "reference portion 210") of the optical pulse 204 toward a reference SPAD imaging array 212. A second portion 214 (which may be referred to herein as "return portion 214") of the optical pulse 204 is reflected off the object 206 in the image scene and is received at the return SPAD imaging array 102.

The return SPAD imaging array 102 may include, for example, an array of between four and several thousand SPAD cells. As will be appreciated by those skilled in the art, SPAD arrays can be used for a variety of applications, including for ranging, for 2D or 3D gesture recognition, facial recognition, and for 3D imaging. A single SPAD cell in the return SPAD imaging array 102 may be associated with a single pixel 114 shown in FIG. 1, and each SPAD cell may provide an output pulse or detectable SPAD event when a photon in the form of the return portion 214 of the optical pulse 204 is detected by that cell.

The reference SPAD imaging array 212 may be, for example, of the same dimensions or of smaller dimensions than the return SPAD imaging array 102; the reference SPAD imaging array 212 receives an internal reflection (i.e., the reference portion 210 reflected by the optical barrier 208) of the transmitted optical pulse 204. In some embodiments, the reference SPAD imaging array 212 is a mono-dimensional array, for example, having only a row or column of SPAD cells. Each SPAD cell in the reference SPAD imaging array 212 provides an output pulse or detectable SPAD event when a photon in the form of the reference portion 210 of the optical pulse 204 is detected by that cell.

The return SPAD imaging array 102 is coupled to readout circuitry 216 through a return path, which includes return front end circuitry 218 and a return routing channel 220. Similarly, the reference SPAD imaging array 212 is coupled to the readout circuitry 216 through a reference path that includes reference front end circuitry 222 and a reference routing channel 224.

The return front end circuitry 218 and the reference front end circuitry 222 may include any front end processing circuitry for processing, quantizing in time, shaping, or otherwise detecting the receipt of a photon by the return SPAD imaging array 102 and reference SPAD imaging array 212, respectively, including, for example, pulse shaping and OR-tree circuitry. As discussed above, the return front end circuitry 218 and reference front end circuitry 220 are coupled to the readout circuitry 216 via the return routing channel 220 and the reference routing channel 224, respectively. The return and reference routing channels 220, 224 are conductive routing paths for transmitting the signals received from the return SPAD front end circuitry 218 and reference SPAD front end circuitry 222, respectively, to the readout circuitry 216.

The readout circuitry 216 receives signals representing detected photons from both the return SPAD imaging array 102 and the reference SPAD imaging array 212 (after processing by the respective SPAD front end circuitry 218, 222 and transmission through the respective routing channels 220, 224). The readout circuitry 216 utilizes suitable circuitry, such as time-to-digital converters (TDCs), to generate a time-of-flight (ToF) measurement, which is a signal indicative of a temporal difference between the transmission of the optical pulse 204 and the arrival of the returned portion 214 of the optical pulse 204 at the return SPAD imaging array 102. The ToF measurement for the $n^{th}$ pixel of the return SPAD imaging array 102 may represent a depth value $D_n$ for the $n^{th}$ pixel, which may be indicative of a distance between the $n^{th}$ pixel and at least a portion of the object 206. The depth values for all the pixels 114 of the return SPAD imaging array 102 may then be used by the processor 226 to generate a depth map. The depth map may be used by the processor 226 for at least one of the following purposes: (1) determining whether the object 206 is located within the field of view of the imaging system 200; (2) reconstructing an image of the object 206; (3) determining a distance between the imaging system 200 and the object 206; (4) detecting and/or classifying motion of the object 206; (5) determining a gesture performed by the object 206 (e.g. in the case the object 206 is a human being); or (6)

identifying features (e.g. facial features) of the object 206 (e.g. in the case the object 206 is a human face).

To increase accuracy in the ToF measurements, the light-emitting device 202 may emit multiple optical pulses 204, and the return SPAD imaging array 102 may receive multiple return portions 214 of the optical pulse 204. Similarly, the reference SPAD imaging array 212 may receive multiple reference portions 210 of the optical pulse 204. In such embodiments, the processor 226 may create a histogram of the multiple ToF measurements for each pixel 114 of the sensor array 102. The depth map may, consequently, be based on the histogram of each pixel 114 of the return SPAD imaging array 102 rather than on a single ToF measurement.

Figure 3:
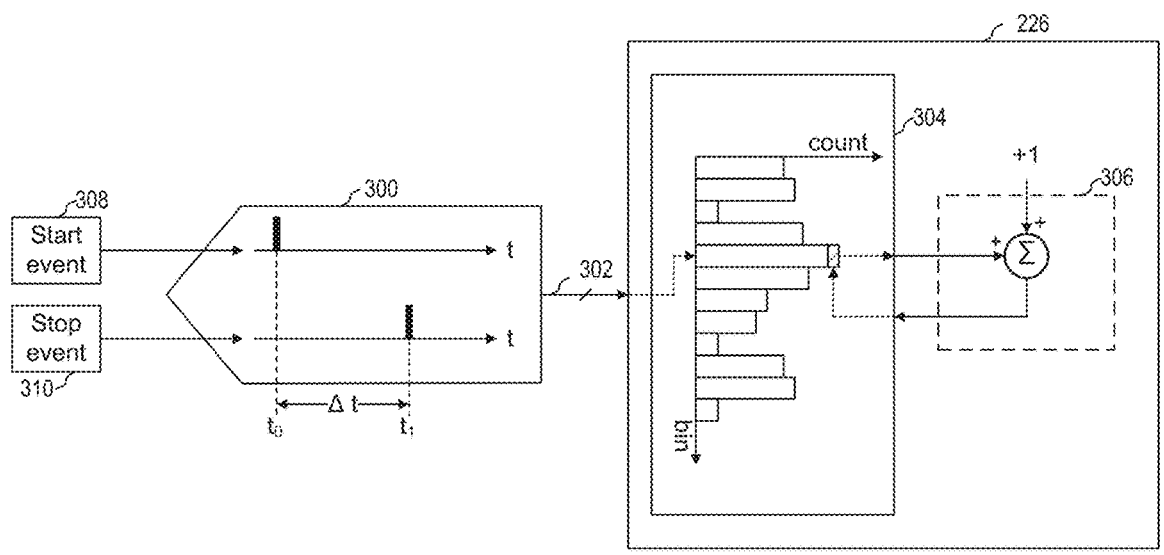
FIG. 3 shows a time-to-digital converter coupled to a processor and an exemplary process of creating a histogram based on time-of-flight measurements, in accordance with an embodiment.

FIG. 3 shows a time-to-digital converter 300 coupled to the processor 226 and an exemplary process of creating a histogram for a respective pixel 114 of the return SPAD imaging array 102 based on a ToF measurement. During normal operation, the light-emitting device 202 emits multiple optical pulses 204 and the return SPAD imaging array 102 receives multiple return portions 214. Each time an optical pulse 204 is emitted and a corresponding return portion 214 is detected at a given pixel, TDC 300 sends a digital code 302 to the processor 226 based on a time $\Delta t$, which is indicative of the time between a time $t_0$ of the emission time of optical pulse 204 and a time $t_1$ of the reception of the return portion 214 of the optical pulse 204. The processor 226 receives the digital code 302 and updates a histogram 304 by using an accumulator 306 that increments, by +1, the bin in the histogram 304 associated with the digital code 302.

Figure 4:
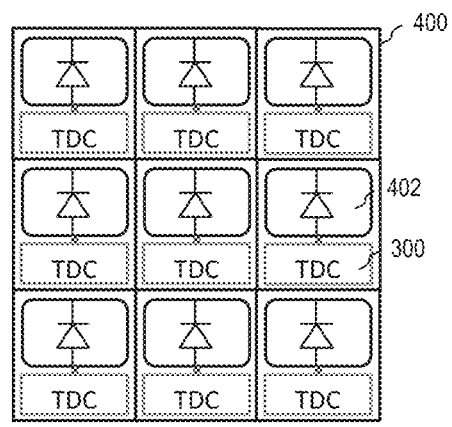
FIG. 4 shows an imaging device including one time-to-digital converter (TDC) per SPAD in the return SPAD imaging array of FIG. 2, in accordance with an embodiment.

Some imaging devices 200 may be implemented with one TDC per SPAD in the return SPAD imaging array 102. FIG. 4 shows an example where the imaging device 200 includes one TDC 300 per SPAD 402 in the return SPAD imaging array 102. As shown in FIG. 4, the sensor array 102 includes an SPAD cluster 400 that includes 9 SPADs 402, where each of the 9 SPADs 402 is connected to a respective TDC 300. During normal operation, optical pulse 204 stimulates one or more of the SPADs of SPAD cluster 400. The respective TDC 300 interprets each time the optical pulse 204 is emitted as a start event 308 (e.g. shown in FIG. 3) and each time the respective SPAD 402 is stimulated as a stop event 310 (e.g. shown in FIG. 3). The processor 226 generates one histogram per TDC 300 of the SPAD cluster 400 and/or a single histogram for the entire SPAD cluster 400. However, some systems may reduce the number of TDCs by using an OR tree, as described below in the example of FIG. 5.

Figure 5:
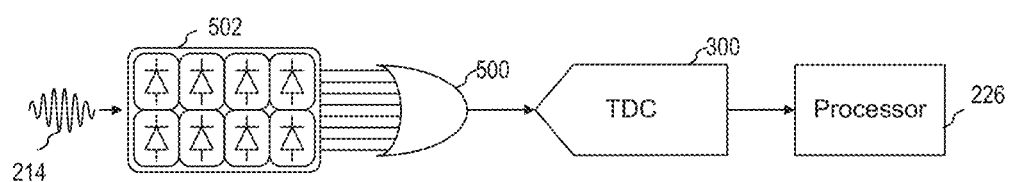
FIG. 5 shows an implementation of an OR tree in a readout circuitry of the imaging system 200 shown in FIG. 2, in accordance with an embodiment.

FIG. 5 shows an exemplary implementation of an OR tree 400 in the readout circuitry 216 of the imaging device 200. As shown in FIG. 5, the sensor array 102 includes an SPAD cluster 502 that includes 8 SPADs, where each of the 8 SPADs is connected to the OR tree 500. During normal operation, optical pulse 204 stimulates one or more of the SPADs of SPAD cluster 502. Each time one or more SPADs of SPAD cluster 502 is stimulated, the output of the OR tree 500 is asserted. The TDC 300 interprets each time optical pulse 204 is emitted as a start event 308 (e.g. shown in FIG. 3) and each time the output of the OR tree 400 is asserted as a stop event 310 (e.g. shown in FIG. 3).

The TDC 300 typically operates with a clock frequency similar to that of the imaging device 200. Even though it is possible to generate fast clock frequencies in a particular imaging device 200 (e.g., 1 GHz, 2 GHz, 4 GHz, or others), the maximum operating frequency of the imaging system 200 is often limited by factors such as power consumption, timing constraints limitations and process limitations, among others. Some imaging systems 200, therefore, use TDCs having a time resolution greater than one TDC clock cycle. A possible implementation of the TDC 300 uses multiple clocks running at the operating frequency of the imaging system 200, where each of the multiple clocks is a delayed replica (i.e., different phase) of a phased locked loop (PLL) clock. To create depth maps using an array of SPAD sensors, a histogram of photon arrival times must be created for each pixel 114, and then processed in order to extract the time-of-flight value for that pixel (e.g. using methods known in the art). The precision of the time-of-flight measurement, and hence of the depth values in the map, depends upon the temporal resolution of the histogram bins.

Figure 6:
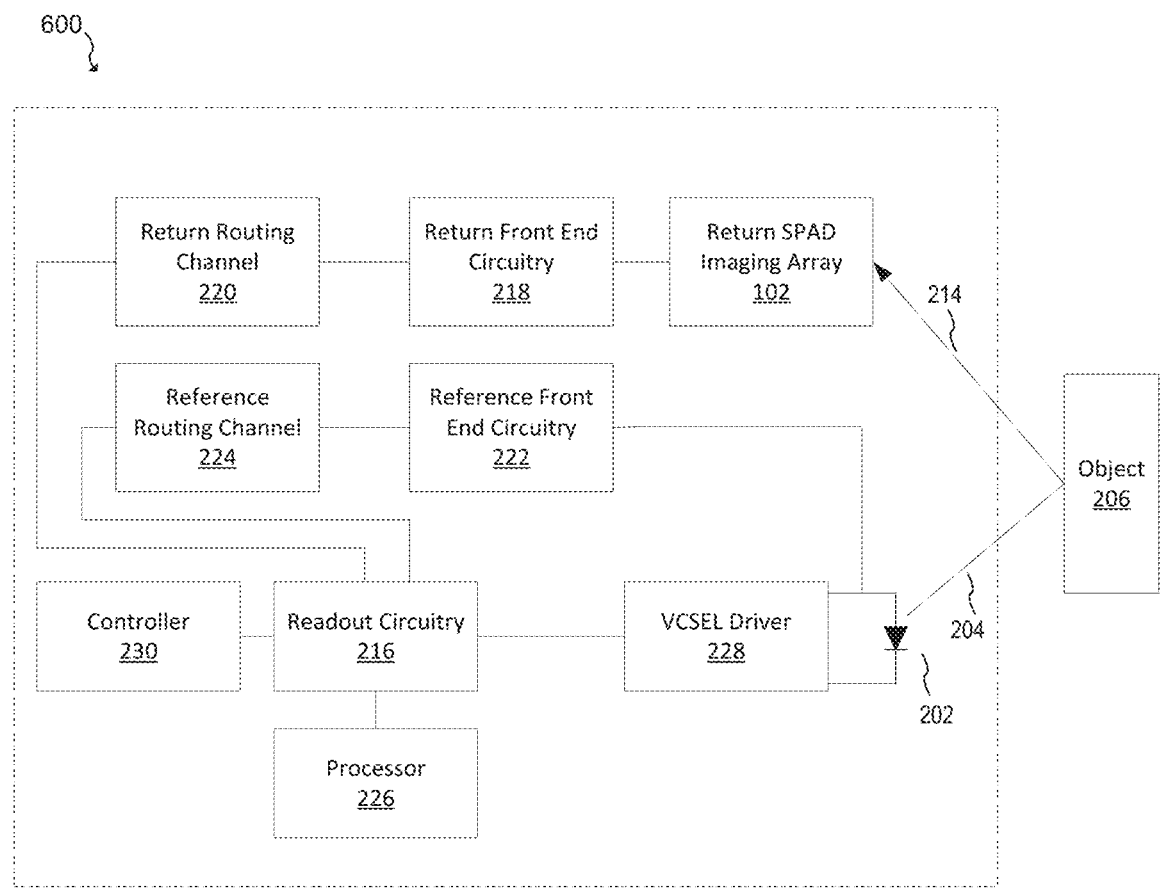
FIG. 6 shows an imaging system similar to the imaging system of FIG. 2 but that is devoid of an optical barrier, in accordance with an embodiment.

FIG. 6 shows an imaging system 600 that is devoid of an optical barrier, in accordance with an embodiment. The imaging system 600 of FIG. 6 is similar in structure and function to the imaging system 200 of FIG. 2 except for the differences that will be discussed below. The features common to both the imaging systems 200 and 600 are not described again in the interest of brevity. The main difference between the imaging system 200 shown in FIG. 2 and the imaging system 600 shown in FIG. 6 is that the reference SPAD imaging array 212 in FIG. 2 is not present in the imaging system 600 of FIG. 6. Instead, the imaging system 600 includes a reference path that is electrically coupled to the light-emitting device 202 and thus receives the driving signal provided to the light-emitting device 202 (which may be a VCSEL, as shown in FIG. 6) from the driver 228 (which may be a VCSEL driver, as shown). That is, the reference path receives, as a reference signal, the driving signal provided to the light-emitting device 202. This reference signal is then routed through the reference SPAD front end circuitry 222 and the reference routing channel 224, just like in the imaging system 200 of FIG. 2.

The reference signal thus mimics the function of the reference portion 210 of the optical pulse 204 that is received by the reference SPAD imaging array 212 in the imaging system 200 of FIG. 2. That is, the reference signal received from the driving signal to the light-emitting device 202, in the imaging system 600, serves as a reference time and the depth map may be determined by processor 226 based on the time difference between receiving, by the readout circuitry 216, the return portion 214 of the optical pulse 204 (after processing through the return front end circuitry 218 and the return routing channel 220) and the reference or driving signal (after processing through the reference front end circuitry 222 and the reference routing channel 224).

Figure 7A:
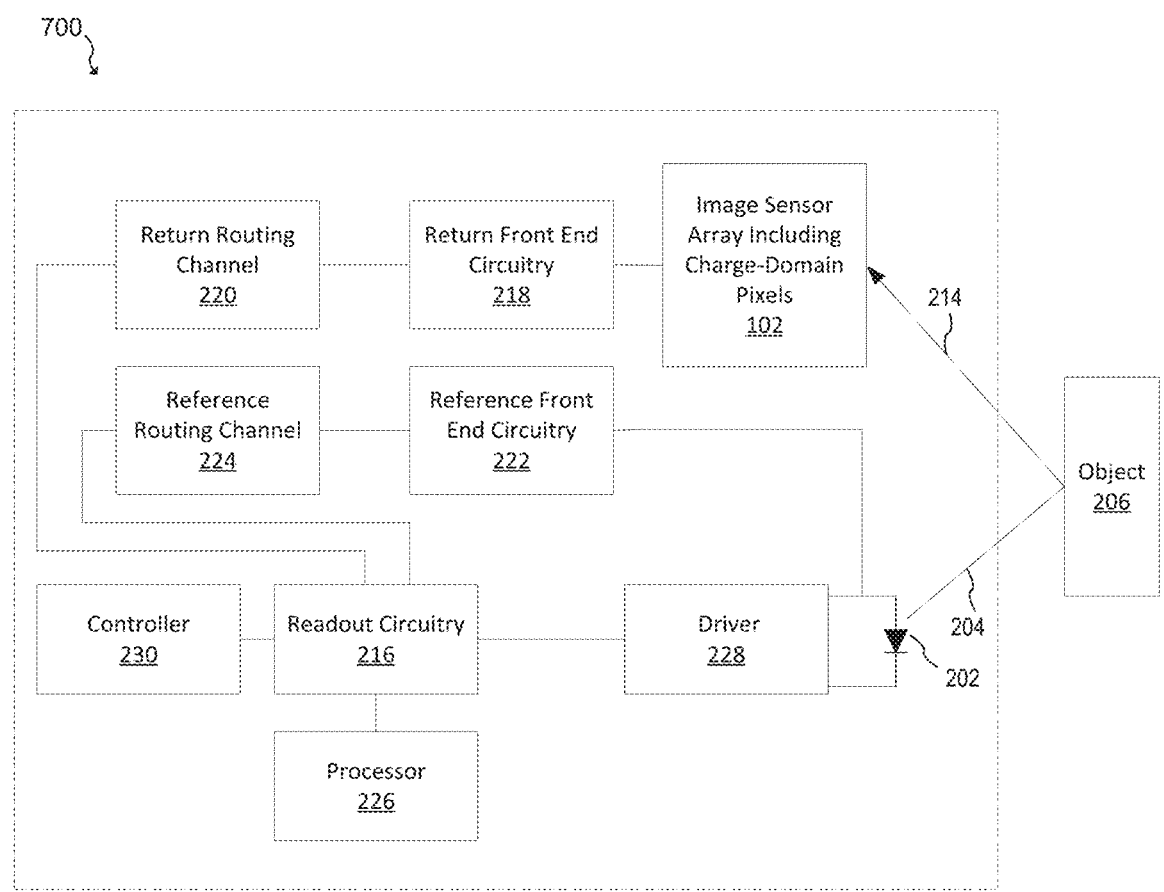
FIG. 7A shows an imaging system where each pixel is implemented using a charge-domain pixel, in accordance with an embodiment.
Figure 7B:
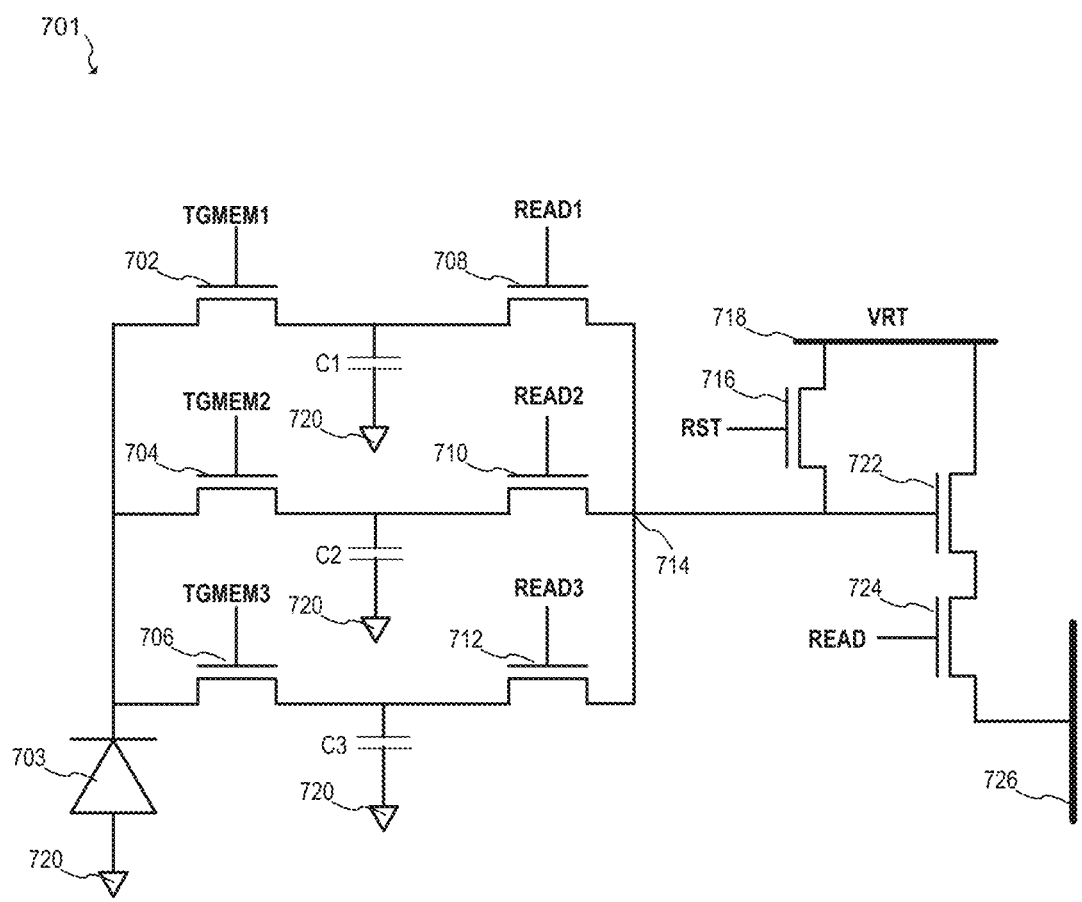
FIG. 7B schematically illustrates a charge-domain pixel having CMOS architecture, in accordance with an embodiment.

The embodiments described in FIGS. 2-6 assume that the sensor array 102 is implemented as a return SPAD imaging array. However, as discussed above, each pixel 114 may be implemented, for example, as a charge-domain pixel (e.g. using a fast photodiode, a photo-gate, a CAPD, or a lock-in photo demodulator). FIG. 7A shows an imaging system 700 where each pixel 114 of the image sensor array 102 is implemented using a charge-domain pixel, in accordance with an embodiment. It is noted that while the example of FIG. 7A is directed to a 3-bin pixel, such disclosure is not meant to be limiting and each pixel 114 may be implemented as an N-bin pixel, where N=2, 4, 5, 6, 7, 8, and so on. The improvements proposed for the 3-bin pixel of FIG. 7A are also available for and realizable in other N-bin pixels. The imaging system 700 of FIG. 7A is similar in structure and function to the imaging system 600 of FIG. 6 except for the image sensor array 102 in FIG. 7A being implemented using charge-domain pixels, examples being a fast photodiode, a photo-gate, a CAPD, or a lock-in photo demodulator. FIG. 7B schematically illustrates a charge-domain pixel 701 that may be used to implement each of the pixels 114 of the image sensor array 102 in FIG. 7A, in accordance with an embodiment.

As shown in FIG. 7B, charge-domain pixel 701 may include a photosensitive element 703 (e.g. a fast photodiode, a photo-gate, a CAPD, or a lock-in photo demodulator), a first charge transfer transistor 702, a second charge transfer transistor 704, a third charge transfer transistor 706, a first internal memory element C1, a second internal memory element C2, a third internal memory element C3, a fourth charge transfer transistor 708, a fifth charge transfer transistor 710, a sixth charge transfer transistor 712, a floating diffusion node 714, a reset transistor 716, a pixel supply voltage terminal 718, a source follower transistor 722, a row select transistor 724, and an output line 726 (e.g. column line). The photosensitive element 703 may have a p-type terminal that is connected to a ground line 720 (e.g., a ground power supply line on which a ground power supply voltage signal is provided) and an n-type terminal. The charge transfer transistors 702, 704, 706, 708, 710, 712 may sometimes be referred to as "charge transfer gates."

The internal memory elements C1, C2, and C3 may be complementary metal-oxide-semiconductor (CMOS) capacitors or diffused diodes (as examples). The memory element C1 may have a first terminal that is connected to the ground line 720 and a second terminal that is coupled to the photosensitive element 703 via the first charge transfer gate 702 and to the floating diffusion node 714 via the fourth transfer gate 708. The memory element C2 may have a first terminal that is connected to the ground line 720 and a second terminal that is coupled to the photosensitive element 703 via the second charge transfer gate 704 and to the floating diffusion node 714 via the fifth transfer gate 710. The memory element C3 may have a first terminal that is connected to the ground line 720 and a second terminal that is coupled to the photosensitive element 703 via the third charge transfer gate 706 and to the floating diffusion node 714 via the sixth transfer gate 712.

The memory elements C1, C2, and C3 may be reset to some potential between the pinned potential of the photosensitive element 703 and a voltage of the floating diffusion node 114 by asserting pixel supply voltage VRT on the terminal 718 to the desired potential and by asserting the control signals RST, READ1, READ2, and READ3. The floating diffusion node 714 may be reset to a potential higher than the reset potentials of memory elements C1, C2, and C3 by asserting pixel supply voltage VRT to the desired higher potential and by asserting control signal RST high while keeping control signals READ1, READ2, and READ3 low. Resetting the floating diffusion node 714 to a higher potential may be part of a correlated double sampling readout.

The photosensitive element 703 may receive incoming photons and generate charge in response to receiving the incoming photons. Charges generated by the photosensitive element 703 may be selectively stored in: (a) the memory element C1 by turning on the first charge transfer gate 702 (e.g., by asserting control signal TGMEM1 high at the gate terminal of transistor 702); (b) the memory element C2 by turning on the second charge transfer gate 704 (e.g., by asserting control signal TGMEM2 high at the gate terminal of transistor 704); and (c) the memory element C3 by turning on the third charge transfer gate 706 (e.g., by asserting control signal TGMEM3 high at the gate of transistor 706). Charge stored on memory elements C1, C2, and C3 may be transferred one-by-one to the floating diffusion node 714 by asserting the control signals READ1, READ2, and READ3, respectively, to complete correlated double sampling readout via the source follower 722, the row select transistor 724, and the output 726 (e.g. control signal READ is high during readout and low during light charge acquisition phase).

Figure 8A:
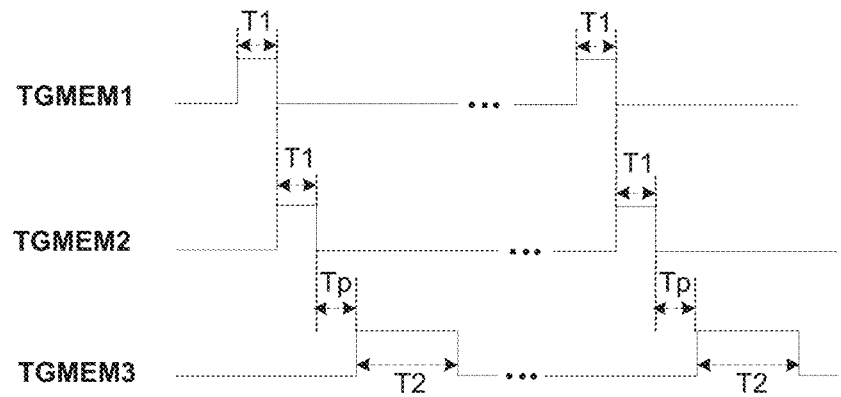
FIG. 8A shows a simplified timing diagram for control signals provided to the pixel shown in FIG. 7B.

FIG. 8A shows how control signals TGMEM1, TGMEM2, and TGMEM3 (shown in FIG. 7B) may be controlled during an acquisition phase during which charge, generated by the photosensitive element 703, is stored in the memory elements C1, C2, and C3. As shown in FIG. 8A, control signal TGMEM1 may first be pulsed high for duration T1 (while control signals TGMEM2 and TGMEM3 are pulsed low). The TGMEM1 control signal may be synchronized with the activation of the light-emitting device 202 in FIG. 7A. In other words, the light-emitting device 202 may be turned on for duration T1 and in synchronization with control signal TGMEM1. When control signal TGMEM1 is deasserted, the light-emitting device 202 may also be synchronously turned off.

The control signal TGMEM2 may be pulsed high immediately after the control signal TGMEM1. The control signals TGMEM1 and TGMEM2 are pulsed high for the same duration (e.g., control signal TGMEM2 may also be pulsed high for duration T1). Charge gathered when control signal TGMEM1 is asserted may be attributed to both backlight and the return portion 214 of the optical pulse 204 reflected off the object 206. Charge gathered when control signal TGMEM2 is asserted may be attributed to background light and any remaining light that is being reflected off the object 206. It is noted that while the control signal TGMEM2 is asserted, photons are no longer being emitted from the light-emitting device 202 (since the light-emitting device 202 was turned off in synchronization with control signal TGMEM1).

Following the deassertion of control signal TGMEM2, the control signal TGMEM3 may be pulsed high for a duration T2 after a pause Tp. The pause period Tp between the end of the control signal TGMEM2 and the start of the control signal TGMEM3 may be helpful in suppressing any residual contribution from the light-emitting device 202 due to secondary reflections. Charge collected in memory element C3 when the control signal TGMEM3 is pulsed high may represent only background light.

The pulse duration T2 for the control signal TGMEM3 may be the same or substantially greater than the pulse duration T1 associated with the control signals TGMEM1 and TGMEM2. In some embodiments, the duration T2 may be at least two times longer than the duration T1 (e.g., at least 10 times longer than the duration T1). As an example, duration T1 may be 200-300 nanoseconds while duration T2 may be 2 to 30 microseconds or more. As a result, the storage capacity of memory element C3 may be much larger than that of memory elements C1 and C2 (e.g., the ratio of C3 to C1 and the ratio of C3 to C2 may be proportional to the ratio of duration T2 to duration T1). For example, in the scenario in which duration T2 is two times longer than duration T1, the capacity of memory element C3 may be at least two times larger than the capacity of each of memory elements C1 and C2. This sequence of control signals TGMEM1, TGMEM2, and TGMEM3 may be repeated many times per frame.

Figure 8B:
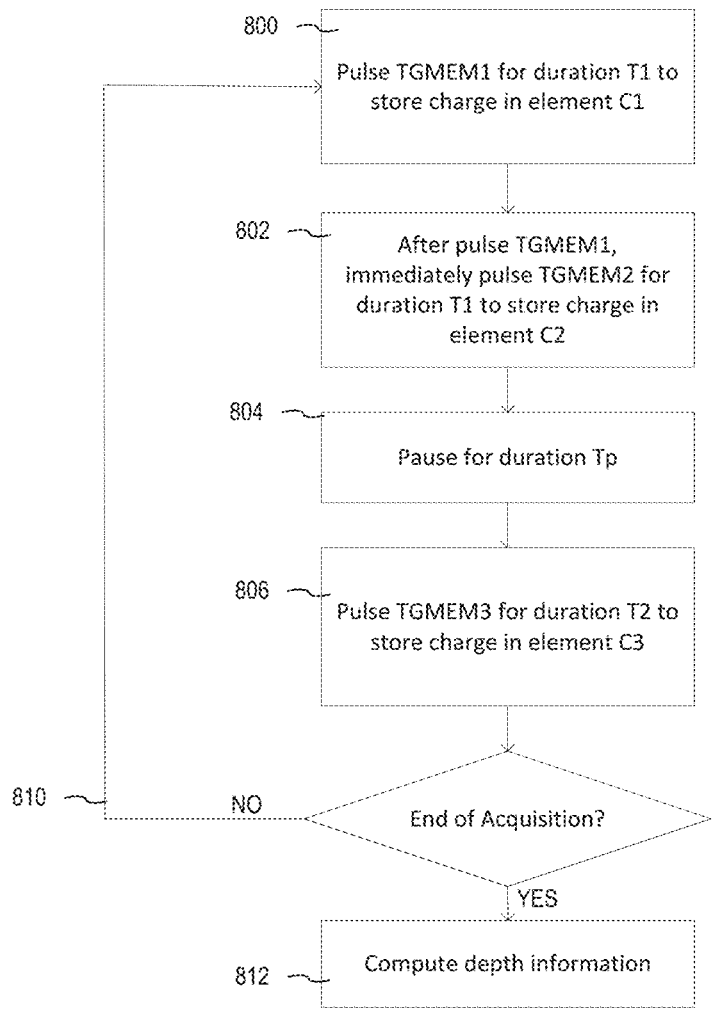
FIG. 8B shows a flow chart of illustrative steps involved in operating the pixel shown in FIG. 7B.

FIG. 8B is a flow chart of illustrative steps involved in operating a time-of-flight image sensor pixel of the type described in connection with FIGS. 7A, 7B, and 8A. At step 800, control signal TGMEM1 may be pulsed high to turn on the first charge transfer gate 702 for duration T1 to store charge on memory element C1 (this charge is associated with a signal S1). During this time, the light-emitting device 202 is also turned on. At step 802, the control signal TGMEM2 may be pulsed high immediately after the control signal TGMEM1 to turn on the second charge transfer gate 704 for duration T1 to store charge on memory element C2 (this charge is associated with a signal S2). During this time, the light-emitting device 202 is turned off. Following the deassertion of control signal TGMEM2, there may be a wait period Tp (in step 804) before control signal TGMEM3 is asserted (in step 806).

At step 806, following the wait period Tp, the control signal TGMEM3 may be pulsed high to activate the third charge transfer gate 706 for duration T2 to store charge on memory element C3 (this charge is associated with a signal Sbg). As mentioned above, the signal Sbg represents only background information. Steps 800, 802, 804, and 806 may be repeated multiple times per image frame, as indicated by return path 810. During each repeated cycle, additional charge may be accumulated on each of the memory elements C1, C2, and C3. In such embodiments, the signals S1, S2, and Sbg may represent the cumulative signal stored at each of memory elements C1, C2, and C3, respectively, at the end of the acquisition period and may be acquired via correlated double sampling technique known in the art.

At step 812, signal processing circuit 108 (e.g. shown in FIG. 1) may compute the depth information/value for an $n^{th}$ pixel of the sensor array 102 based on signals S1, S2, Sbg stored in memory element C1, C2, and C3 of the $n^{th}$ pixel, the durations T1, T2, and a calibration pixel constant $Pc_n$. As an example, the depth value $D_n$ for the $n^{th}$ pixel may be determined according to the following equation: $D_n=(S2-(T1/T2)*Sbg)/(S1-T2*Sbg)*Pc_n$.

As described above, the signal S1 may represent the cumulative signal stored at memory element C1; the signal S2 may represent the cumulative signal stored at memory element C2; the signal Sbg may represent the cumulative-signal stored at memory element C3; duration T1 may be the duration for which control signals TGMEM1 and TGMEM2 are pulsed high; and duration T2 may be the duration for which control signal TGMEM3 is pulsed high. The pixel constant $Pc_n$ may be derived based on a sensor array model that takes into account delays within the image pixel circuitry and the speed of light and may also be extracted using per pixel calibration operations. Per pixel calibration may produce relatively accurate results since it takes into account the delay associated with each specific pixel 114 of the sensor array 102.

During always-on sensing applications (such as continuous measurement, sensing, or detection of human/object presence, motion, and activity), the imaging systems 200, 600, 700 may exhibit high power consumption. The major contributors to power consumption during always-on sensing applications may include, and may not be limited to, at least one of the following: (1) generation of column select signals 107 that may include multiple clocks having different phases (i.e., generation of a multi-phase clock distribution); (2) pixel readout (e.g. generation of control signals for readout charge generated in each pixel 114 of the sensor array 102); and (3) the time-of-flight image signal processing pipeline.

In addition to high power consumption, the imaging systems 200, 600, and 700 can suffer from a long readout time since the signal from each pixel 114 of the sensory array 102 is read out and used for subsequent processing (e.g. generation of a depth value and a corresponding depth map). Furthermore, since a large number of pixels/signals are used in the image signal processing pipeline that generates a fine spatial resolution depth map, the imaging systems 200, 600, and 700 may suffer from slow response times, i.e., the processing of a large number of pixels/signals slows down the imaging system's ability to efficiently and quickly determine whether the object 206 is located in the field of view of the imaging system and to switch to a high-power mode for full resolution in response to a determination that the object 206 is located in the field of view of the imaging system. This may, consequently, have an effect of increasing the time needed by the imaging systems 200, 600, and 700 to reconstruct an image of the object 206, determine a distance between the imaging system and the object 206, detect and/or classify motion of the object 206, determine a gesture performed by the object 206 (e.g. in the case the object 206 is a human being), and/or identify features (e.g. facial features) of the object 206 (e.g. in the case the object 206 is a human face).

Figure 9:
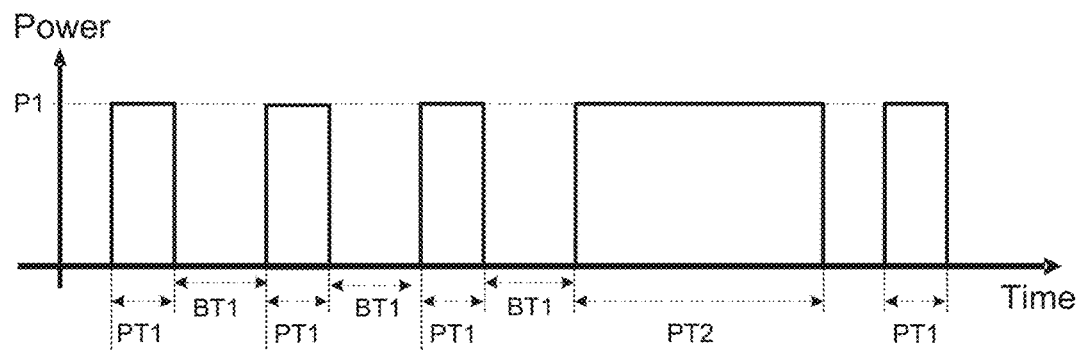
FIG. 9 shows a general power consumption profile of imaging devices during a conventional always-on operation.

FIG. 9 shows a general power consumption profile of the imaging devices 200, 600, 700 during a conventional always-on operation. As shown in FIG. 9, in a conventional always-on operation, the imaging systems 200, 600, 700 may have a first power consumption level P1 during first processing periods PT1 during which an image is captured (e.g. using the sensor array 102). Consecutive first processing periods PT1 may be separated by a first blanking period BT1, and the imaging systems 200, 600, 700 may be configured to determine, during each first blanking periods BT1, whether the object 206 has moved into the field-of-view of the imaging systems 200, 600, 700 based on the image captured during a preceding (e.g. immediately preceding) first processing period PT1. The duration of the first blanking periods BT1 may depend, at least in part, on the number of pixels 114 used to capture an image during the first processing periods PT1. In response to a determination that the object 206 has moved into the field-of-view, the imaging systems 200, 600, 700 may enter into a second processing period PT2, which may be greater in duration than the first processing period PT1. The second processing period PT2 may be used to capture an image and execute of an image signal processing pipeline that generates a high/full resolution depth map, which, in turn, may be used by the imaging devices 200, 600, 700 to reconstruct an image of the object 206, determine a distance between the imaging system and the object 206, detect and/or classify motion of the object 206, determine a gesture performed by the object 206 (e.g. in the case the object 206 is a human being), and/or identify features (e.g. facial features) of the object 206 (e.g. in the case the object 206 is a human face). Consequently, power consumption during the second processing period PT2 may be at least equal to the first power consumption level P1, albeit for a longer period of time, as shown in FIG. 9.

In order to reduce power consumption in the imaging systems 200, 600, 700 during an always-on operation, the main contributions to power consumption need to be addressed, namely, generation of column select signals 107 that may include multiple clocks having different phases (i.e., generation of a multi-phase clock distribution), pixel readout (e.g. generation of control signals for readout charge generated in each pixel 114 of the sensor array 102), and the time-of-flight image signal processing pipeline. It has also been observed that for a wide range of always-on applications (e.g., presence detection), a low-spatial resolution depth map is acceptable for at least a portion of the always-on operation since an initial objective is to merely detect if the object 206 has moved into the field-of-view of the imaging systems 200, 600, 700. In view of these observations, the paragraphs that follow propose a low-power always-on mode where a low-spatial resolution frame is captured and used for the initial objective of determining whether the object 206 has moved into the field-of-view of the imaging systems 200, 600, 700. Since the frame captured has low spatial resolution and a lower number of signal outputs to be read from the sensor array 102 (e.g. in comparison with the examples discussed above), readout time of signals from the sensor array 102 is shorter (e.g. in comparison with the examples discussed above). The reduced readout time allows for a quick generation of a coarse-resolution depth map that can be used to initially determine whether the object 206 has moved into the field-of-view of the imaging systems 200, 600, 700. In response to a determination that the object 206 is in the field-of-view, the imaging systems 200, 600, 700 may then shift into a high-power and high-resolution mode where all pixels 114 of the sensor array 102 are utilized to generate signals that are subsequently used to generate a fine-resolution depth map. The fine-resolution depth map, as the name implies, has a finer/higher spatial resolution compared to the coarse-resolution depth map. The fine-resolution depth map may be used for the more time-and-power consuming task of reconstructing an image of the object 206, determining a distance between the imaging device and the object 206, detecting and/or classifying motion of the object 206, determining a gesture performed by the object 206 (e.g. in the case the object 206 is a human being), and/or identifying features (e.g. facial features) of the object 206 (e.g. in the case the object 206 is a human face).

Figure 10:
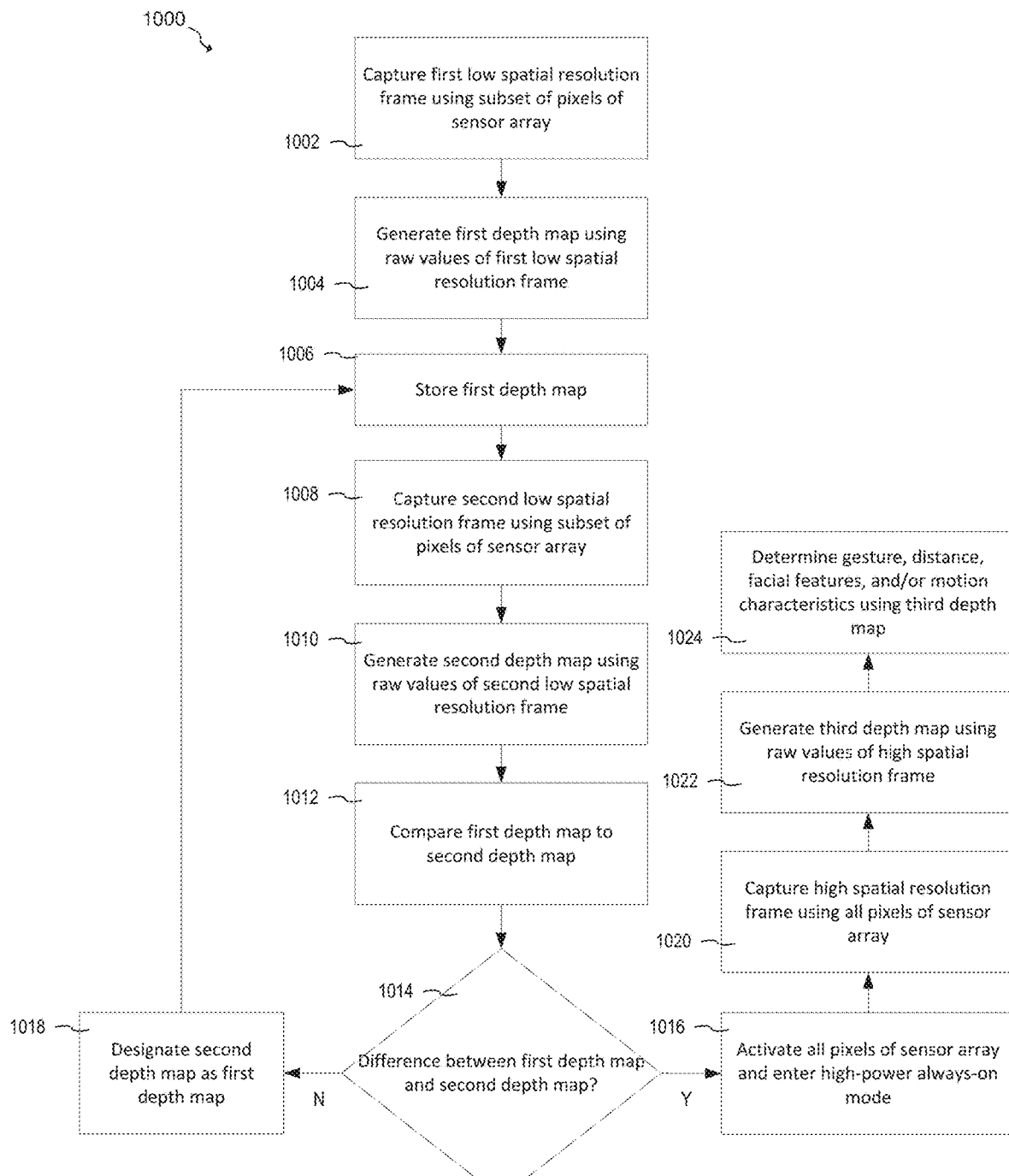
FIG. 10 shows a flow chart illustrating a method of operating a pixel circuit so as to reduce overall power consumption, in accordance with an embodiment.

FIG. 10 shows a flow chart illustrating a method 1000 of operating a pixel circuit, in accordance with an embodiment. The method 1000 may be used to operate the imaging systems 200, 600, 700 to reduce power consumption. The method 1000 includes the steps of: capturing a first low spatial resolution frame using a subset of the pixels 114 of the sensor array 102 (in step 1002); generating a first depth map using raw values of the first low spatial resolution frame (in step 1004); storing the first depth map (in step 1006); capturing a second low spatial resolution frame using the subset of the pixels 114 of the sensor array 102 (in step 1008); generating a second depth map using raw values of the second low spatial resolution frame (in step 1010); and comparing the first depth map to the second depth map (in step 1012). The method 1000 also includes the step of determining whether there is a difference between the first depth map and the second depth map (in step 1014). In response to a determination that there is a difference, the method 1000 proceeds with activating all pixels 114 of the sensor array 102 and entering a high-power always-on mode (in step 1016). However, in response to a determination that there is no difference, the method 1000 proceeds to designating the second depth map as the first depth map (in step 1018) and repeats itself by storing the newly designated first depth map (in step 1006).

Figure 11:
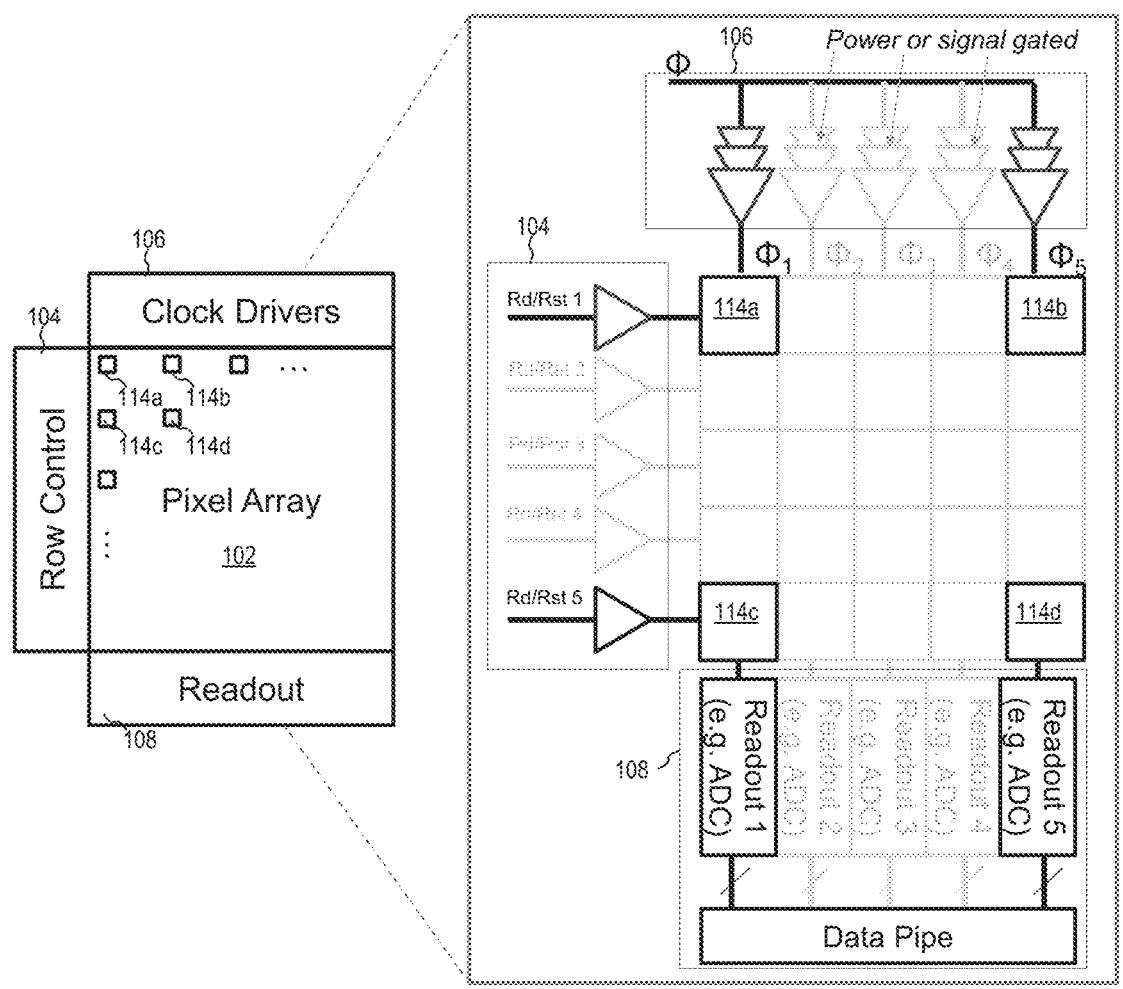
FIG. 11 shows spatial power or signal gating of row select logic, column select logic, and column signal processing circuit of an imaging device, in accordance with an embodiment.

Referring to steps 1002 and 1008 of method 1000, low spatial resolution frames are captured using a subset of pixels 114 of the sensor array 102. This may be achieved by spatial power or signal gating of the row select logic 104, the column select logic 106, and the column signal processing circuit 108. FIG. 11 shows an example of spatial power or signal gating of the row select logic 104, the column select logic 106, and the column signal processing circuit 108 of the imaging device 100, in accordance with an embodiment. Portions of FIG. ii that are grayed out indicated portions of the imaging device 100 that have been deactivated (e.g. by power or signal gating). As an example, one out of every K column driver circuits and one out of every L row driver circuits may be activated (with other driver circuits being deactivated, e.g. by power or signal gating), thereby activating $$\frac{MN}{KL}$$

of the MN pixels 114 of the sensor array 102. Similarly, the column signal processing circuitry (e.g. amplifiers 116 and ADCs 118) associated with the activated pixels may be activated (with other processing circuitry being deactivated, e.g. by power or signal gating). This results in a spatially sub-sampled image being captured by the sensor array 102. The integers K and L may be equal; alternatively or additionally, the integers K and L may each be equal to some integer power of 2.

Referring to steps 1004 and 1010 of method 1000, the raw values of the low spatial resolution frames are read out (e.g. by the activated column signal processing circuitry in, for example, a rolling shutter readout process). However, since less than an entirety of the M rows and less than an entirety of the N columns of the sensor array 102 are used to capture the low spatial resolution frames, the readout is completed in a shorter time compared to a readout operation where all MN pixels 114 of the sensor array 102 are used to capture an image frame.

Figure 12A:
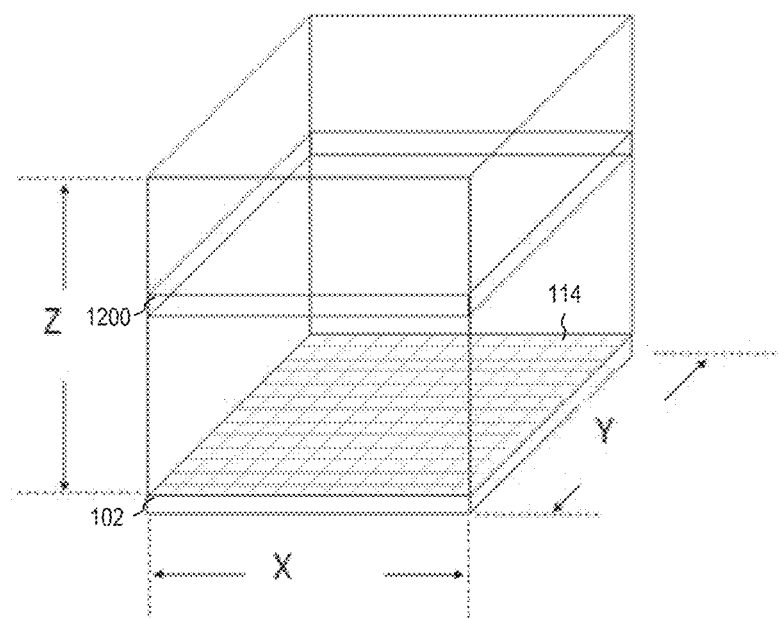
FIG. 12A shows an example of a flat object that is located in front of a sensor array, in accordance with an embodiment.
Figure 12B:
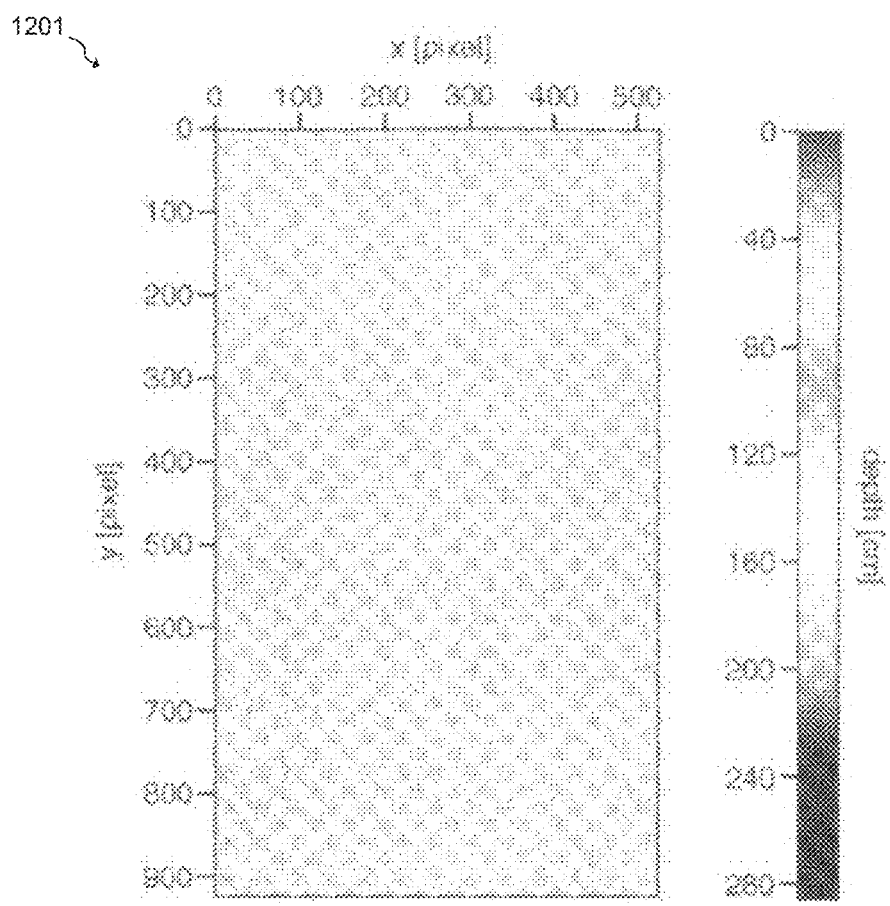
FIG. 12B illustrates a depth map that is generated based on the flat object of FIG. 12A, in accordance with an embodiment.

Again referring to steps 1004 and 1010 of method 1000, depth maps are generated from the raw values of the low spatial resolution frames. The depth maps are essentially three-dimensional surface maps plotted against the spatial positions of the pixels 114 of the sensor array 102 in the x- and y-directions. The depth maps indicate the distance of the object 206 from a given pixel 114 of the sensor array 102 in the x- and y-directions in the z-direction. FIG. 12A shows an example of a flat object 1200 that is located in front of the sensor array 102 such that the distance of the flat object 1200 from each pixel 114 in the z-direction is equal for all pixels 114 of the sensor array 102. FIG. 12B illustrates the depth map 1201 that is generated based on the flat object 1200 of FIG. 12A. As seen in FIG. 12B, the depth map 1201 is uniform across all pixels 114 of the sensor array 102 in the x- and y-directions (e.g. since the distance of the flat object 1200 from each pixel 114 in the z-direction is equal for all pixels 114 of the sensor array 102). The depth map may be generated in steps 1004 and 1010 using methods known in the art. For example, a depth map may be generated from three data values per pixel 114: (a) the respective depth value D. (i.e., the TOF measurement for each pixel 114, as outlined above in reference to FIGS. 2-6, 7A-7B, and 8A-8B); (b) the signal rate (i.e., the respective brightness of the pixel 114; and (c) the respective signal-to-noise ratio (SNR) of the pixel 114, also known as a confidence metric.

Figure 12C:
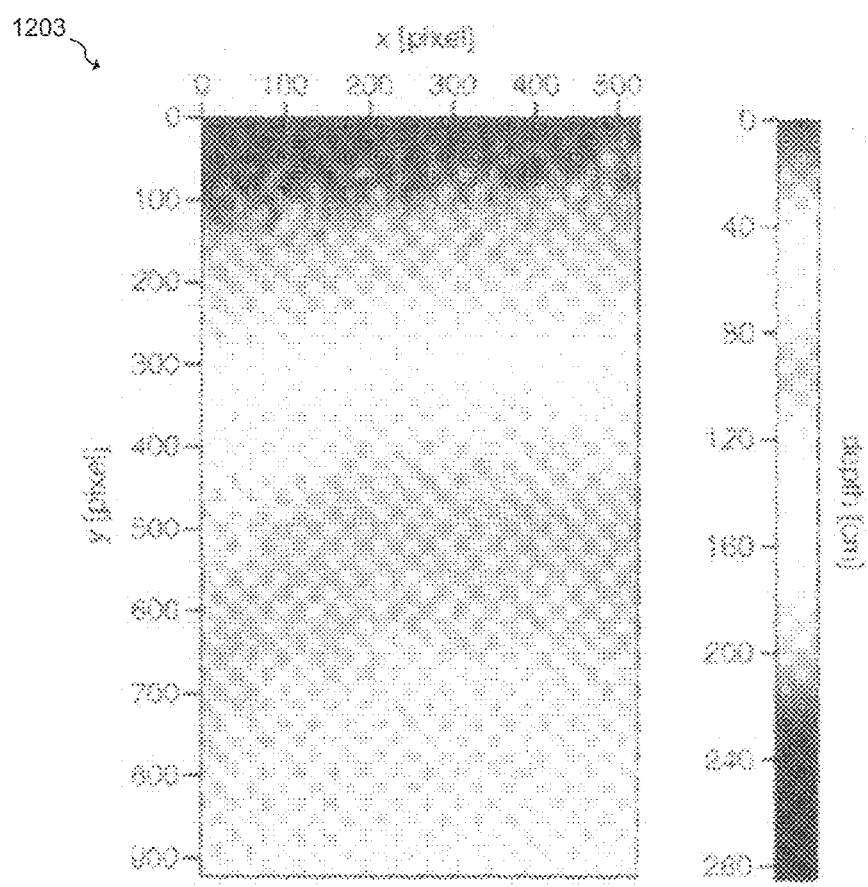
FIG. 12C illustrates a depth map that is generated when the flat object of FIG. 12A tilts, yaws, or rolls, in accordance with an embodiment.

Referring to steps 1012 and 1014 of method 1000, a change in the depth map from one period to the next may indicate that the object 206 has moved in front of the sensor array 102. FIG. 12C illustrates a depth map 1203 that may be generated when the flat object 1200 of FIG. 12A tilts, yaws, or rolls. As seen in the example of FIG. 12C, the depth map 1203 is different from the depth map 1201 of FIG. 12B due to the different portions of the object 1200 being located at different distances from the x-y plane formed by the sensor array 102. Consequently, a change in the depth map from one period to the next may indicate that the object 206 has moved in the field of view of the sensor array 102. In various embodiments, if the computed depth value $D_n$ of the $n^{th}$ pixel 114 (located at a given position of the depth map) changes (e.g. increases or decreases) from one period to the next and if the SNR of the $n^{th}$ pixel 114 is greater than the SNR limit of the pixel 114, this change in the depth value $D_n$ may be interpreted as corresponding to a motion of the object 206 within the field of view of the sensor array. In various embodiments, a change of about 20% in the depth value $D_n$ of the $n^{th}$ pixel 114 from one period to the next may be sufficient to indicate that the imaging system has to exit the low power coarse-resolution mode and enter a high power fine resolution mode (provided that the SNR of the $n^{th}$ pixel 114 is greater than the SNR limit). Additionally or alternatively, if the signal rate of the $n^{th}$ pixel 114 (i.e., the brightness of the $n^{th}$ pixel 114) changes (e.g. increases or decreases) from one period to the next and if the SNR of the $n^{th}$ pixel 114 is greater than the SNR limit of the pixel 114, this change in the pixel's brightness may be interpreted as corresponding to a motion of the object 206 within the field of view of the sensor array. In various embodiments, a change of about 20% in the signal rate of the $n^{th}$ pixel 114 from one period to the next may be sufficient to indicate that the imaging system has to exit the low power coarse-resolution mode and enter a high power fine resolution mode (provided that the SNR of the $n^{th}$ pixel 114 is greater than the SNR limit). In either scenario, if the change in the depth value $D_n$ or the signal rate of the $n^{th}$ pixel 114 is less than the threshold (e.g. 20%) or if the SNR of the $n^{th}$ pixel 114 is less than the SNR limit, the system remains in the low power coarse-resolution mode and another low spatial resolution frame is captured (as indicated by the sequence of steps 1014, 1018, and 1006).

Figure 13:
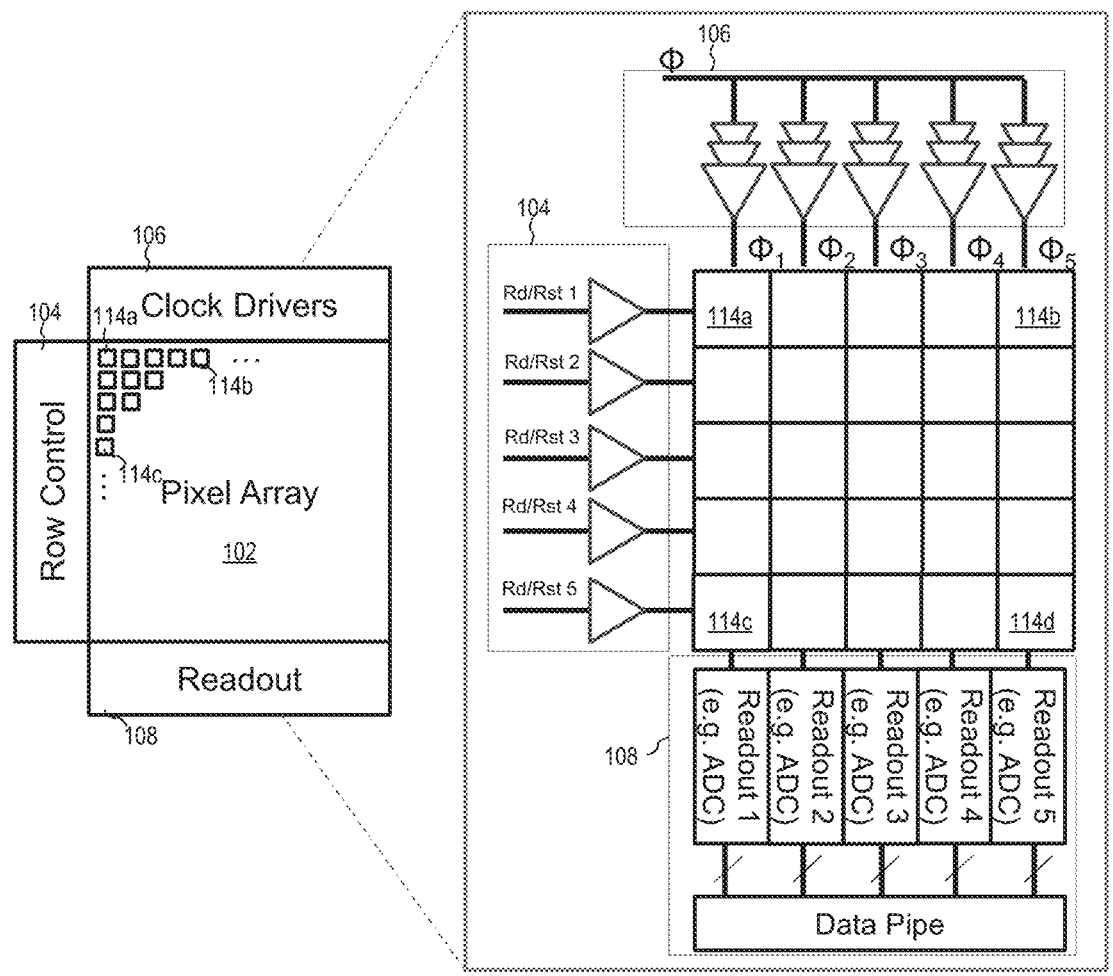
FIG. 13 shows an example where all pixels of an imaging device are activated, in accordance with an embodiment.

Referring to step 1016 of method 1000, in response to a determination that an object is located in the field of view of the sensor array 102, all pixels 114 of the sensor array 102 are activated, thereby allowing capture of a high spatial resolution frame (in step 1020). All pixels 114 of the sensor array 102 may be activated by disabling the spatial power or signal gating of the row select logic 104, the column select logic 106, and the column signal processing circuit 108 of the imaging device 100. FIG. 13 shows an example where all pixels 114 of the imaging device 100 are activated, in accordance with an embodiment. The raw values of the high spatial resolution image are subsequently read out (e.g. using a rolling shutter readout) and used to generate a third depth map, which has a finer spatial resolution compared to the first depth map and the second depth map. The high spatial resolution of the third depth map may be useful since finer spatial resolution may be needed for the more involved task(s) of reconstructing an image of the object 206 located within the field of view of the imaging device 100, determining a distance between the imaging device 100 and the object 206, detecting and/or classifying motion that occurs within the field of view of the imaging device 100, determining a gesture performed within the field of view of the imaging device 100, and identifying features (e.g. facial features) located within the field of view of the imaging device 100 (in step 1024). These parameters may be determined using methods known in the art.

Figure 14:
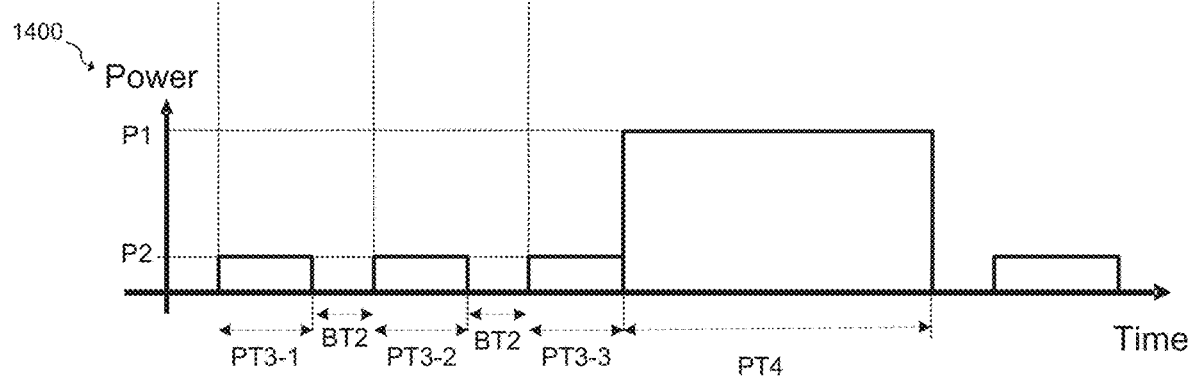
FIG. 14 shows a general power consumption profile during execution of the method shown in FIG. 10, in accordance with an embodiment.
Figure 15:
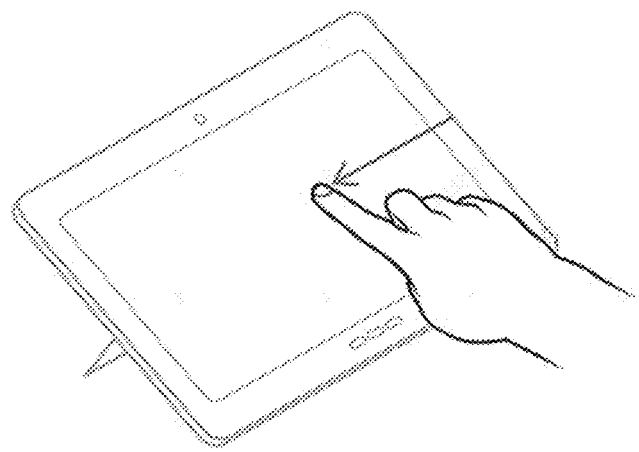
FIG. 15 shows an example of a gesture performed by a human.

FIG. 14 shows a general power consumption profile 1400 during the execution of the method 1000 in FIG. 10, in accordance with an embodiment. As shown in FIG. 14, the imaging systems 200, 600, 700 may have a second power consumption level P2 (that is less than the first power consumption level P1) during third processing periods PT3-1 to PT3-3 during which a low-spatial resolution frame is captured (e.g. using a subset of the pixels 114 of the sensor array 102). As shown in FIG. 14, each of the third processing periods PT3-1 to PT3-3 may be greater in duration than the first processing period PT1, indicating that integration time during each of the low-power third processing periods PT3-1 to PT3-3 is greater than the integration time during the conventional first processing period PT1. Consecutive third processing periods PT3 may be separated by a second blanking period BT2 (that is less than the first blanking period BT1), and the imaging systems 200, 600, 700 may be configured to determine, during each second blanking periods BT2, whether the object 206 has moved into the field-of-view of the imaging systems 200, 600, 700 based on the low-spatial resolution frame and low resolution depth map captured during a preceding (e.g. immediately preceding) third processing period PT3. In response to a determination that the object 206 has moved into the field-of-view, the imaging systems 200, 600, 700 may enter into a fourth processing period PT4, which may be greater in duration than the third processing period PT3. The fourth processing period PT4 may be used to capture a high-spatial resolution image and execute of an image signal processing pipeline that generates a high spatial resolution depth map, which, in turn, may be used by the imaging devices 200, 600, 700 to reconstruct an image of the object 206, determine a distance between the imaging system and the object 206, detect and/or classify motion of the object 206, determine a gesture performed by the object 206 (e.g. as in FIG. 15 in the case the object 206 is a human being), and/or identify features (e.g. facial features) of the object 206 (e.g. in the case the object 206 is a human face). Consequently, overall power consumption of the imaging systems 200, 600, 700 is reduced. Furthermore, system response time is improved since only a short readout time is needed to read the raw values of the subset of pixels 114 during third processing periods PT3.

In summary, the proposed low-power always-on mode utilizes signal or power gating for the row and column drivers, deactivates column parallel data processors (e.g. in the column signal processing circuit 108), spatially subsamples a scene (e.g. since only a subset of pixels 114 are used during the third processing periods PT3), and this, in turn, results in reduced data output from the sensor array 102 and shorter readout times during the third processing periods PT3.

An embodiment method of operating an imaging device including a sensor array including a plurality of pixels, includes: capturing a first low-spatial resolution frame using a subset of the plurality of pixels of the sensor array; generating, using a processor coupled to the sensor array, a first depth map using raw pixel values of the first low-spatial resolution frame; capturing a second low-spatial resolution frame using the subset of the plurality of pixels of the sensor array; generating, using the processor, a second depth map using raw pixel values of the second low-spatial resolution frame; and determining whether an object has moved in a field of view of the imaging device based on a comparison of the first depth map to the second depth map.

An embodiment imaging device includes: a sensor array including an array of pixels; a row driver circuit coupled to the array of pixels and configured to select at least one row of the array of pixels; a column driver circuit coupled to the array of pixels and configured to select at least one column of the array of pixels; and a controller coupled to the row driver circuit and the column driver circuit. The controller is configured to: provide a first timing signal to the row driver circuit and the column driver circuit to select a subset of the array of pixels to capture a first low-spatial resolution frame; and provide a second timing signal to the row driver circuit and the column driver circuit to select the subset of the array of pixels to capture a second low-spatial resolution frame. The embodiment imaging device further includes a processor coupled to receive an output of the array of pixels. The processor is configured to: generate a first depth map using raw pixel values of the first low-spatial resolution frame; generate a second depth map using raw pixel values of the second low-spatial resolution frame; and determine whether an object has moved in a field of view of the imaging device based on a comparison of the first depth map to the second depth map.

An embodiment device includes: a processor; and a non-transitory computer-readable storage medium storing a program to be executed by the processor. The program includes instructions for: capturing a first low-spatial resolution frame using a subset of a plurality of pixels of a sensor array; generating, using a processor coupled to the sensor array, a first depth map using raw pixel values of the first low-spatial resolution frame; capturing a second low-spatial resolution frame using the subset of the plurality of pixels of the sensor array; generating, using the processor, a second depth map using raw pixel values of the second low-spatial resolution frame; and determining whether an object has moved in a field of view of the device based on a comparison of the first depth map to the second depth map.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The devices and processing systems described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a field programmable gate array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating an imaging device comprising a sensor array, the sensor array comprising a plurality of pixels, the method comprising:
    at a first time, capturing a first low-spatial resolution frame using a subset of pixels of the sensor array; and
    at a second time after the first time, capturing a second low-spatial resolution frame using the same subset of pixels of the sensor array;
    generating a first depth map using raw pixel values of the first low-spatial resolution frame;
    generating a second depth map using raw pixel values of the second low-spatial resolution frame; and
    comparing the first depth map to the second depth map to determine whether an object has moved in a field of view of the imaging device.

2. The method of claim 1, further comprising:
    determining that the object has not moved in the field of view of the imaging device;
    at a third time after the second time, capturing a third low-spatial resolution frame using the same subset of pixels of the sensor array;
    generating a third depth map using raw pixel values of the third low-spatial resolution frame; and
    determining whether an object has moved in the field of view of the imaging device based on a comparison of the second depth map to the third depth map.

3. The method of claim 1, further comprising:
    determining that the object has moved in the field of view of the imaging device;
    at a third time after the second time, capturing a high-spatial resolution frame from the sensor array, the high-spatial resolution frame utilizing more pixels than the subset of pixels; and
    generating a third depth map using raw pixel values of the high-spatial resolution frame.

4. The method of claim 3, further comprising determining, based on the third depth map, at least one of a gesture performed by the object, a distance between the object and the imaging device, a feature of the object, or a motion characteristic of the object.

5. The method of claim 1, wherein the raw pixel values of the first low-spatial resolution frame comprise a first time-of-flight measurement, a first brightness, and a first signal-to-noise ratio, and wherein the raw pixel values of the second low-spatial resolution frame comprise a second time-of-flight measurement, a second brightness, and a second signal-to-noise ratio.

6. The method of claim 1, wherein the raw pixel values of the first low-spatial resolution frame comprise a first signalto-noise ratio and the raw pixel values of the second low-spatial resolution frame comprise a second signal-to-noise ratio and wherein it is determined whether the object has moved by determining that the object has not moved in the field of view of the imaging device in response to the first signal-to-noise ratio or the second signal-to-noise ratio being less than a pixel signal-to-noise ratio limit.

7. The method of claim 1, wherein the raw pixel values of the first low-spatial resolution frame comprise a first time-of-flight measurement and the raw pixel values of the second low-spatial resolution frame comprise a second time-of-flight measurement and wherein it is determined whether the object has moved by determining that the object has moved in the field of view of the imaging device in response to a change between the first time-of-flight measurement and the second time-of-flight measurement being greater than a threshold.

8. The method of claim 7, further comprising configuring the threshold based on an application of the imaging device before comparing the first depth map to the second depth map.

9. The method of claim 1, wherein the raw pixel values of the first low-spatial resolution frame comprise a first brightness and the raw pixel values of the second low-spatial resolution frame comprise a second brightness and wherein it is determined whether the object has moved by determining that the object has moved in the field of view of the imaging device in response to a change between the first brightness and the second brightness being greater than a threshold.

10. The method of claim 9, further comprising configuring the threshold based on an application of the imaging device before comparing the first depth map to the second depth map.

11. A method of operating an imaging device comprising a sensor array, the sensor array comprising a plurality of pixels, the method comprising:
at a first time, capturing a first low-spatial resolution frame based on a subset of the pixels of the sensor array;
at a second time after the first time, capturing a second low-spatial resolution frame based on the same subset of the pixels of the sensor array; and
performing a comparison based on the subset of the pixels of the first low-spatial resolution frame and the subset of the pixels of the second low-spatial resolution frame to determine whether an object has moved in a field of view of the imaging device.

12. The method of claim 11, further comprising:
when it has been determined that the object has moved in the field of view, capturing a high-spatial resolution frame using pixels of the sensor array; and
when it has been determined that the object has not moved in the field of view, designating the second low-spatial resolution frame as the first low-spatial resolution frame and, repeating the steps of receiving the second low-spatial resolution frame and performing the comparison to again determine whether the object has moved in the field of view of the imaging device.

13. The method of claim 11, wherein performing the comparison comprises:
generating a first depth map using raw pixel values of the first low-spatial resolution frame;
generating a second depth map using raw pixel values of the second low-spatial resolution frame; and
performing the comparison by comparing the first depth map and the second depth map.

14. The method of claim 11, wherein raw pixel values of the first low-spatial resolution frame comprise a first time-of-flight measurement, a first brightness, and a first signal-to-noise ratio, and wherein raw pixel values of the second low-spatial resolution frame comprise a second time-of-flight measurement, a second brightness, and a second signal-to-noise ratio.

15. The method of claim 11, further comprising:
causing each of the pixels of the sensor array to be activated in response to a determination that the object has moved in the field of view of the sensor array;
capturing a high-spatial resolution frame from the sensor array; and
generating a third depth map using raw pixel values of the high-spatial resolution frame.

16. The method of claim 15, further comprising determining, based on the third depth map, a gesture performed by the object.

17. The method of claim 15, further comprising determining, based on the third depth map, a motion characteristic of the object.

18. The method of claim 15, further comprising determining, based on the third depth map, a distance between the object and the sensor array.

19. The method of claim 15, further comprising determining, based on the third depth map, a feature of the object.

20. The method of claim 15, wherein, in response to a determination that the object has not moved in the field of view of the sensor array, the method further comprises:
at a third time after the second time, capturing a third low-spatial resolution frame based on the same subset of the pixels of the sensor array; and
performing a further comparison based on the subset of the pixels of the second low-spatial resolution frame and the subset of the pixels of the third low-spatial resolution frame to determine whether an object has moved in the field of view of the imaging device.

21. A gesture recognition method comprising:
at a first time, capturing a first low-spatial resolution frame using a subset of pixels of a sensor array; and
at a second time after the first time, capturing a second low-spatial resolution frame using the same subset of pixels of the sensor array;
generating a first depth map using raw pixel values of the first low-spatial resolution frame;
generating a second depth map using raw pixel values of the second low-spatial resolution frame;
determining that an object has moved in a field of view of the sensor array based on a comparison of the first depth map and the second depth map;
in response to determining that the object has moved, capturing a high-spatial resolution frame from the sensor array, the high-spatial resolution frame utilizing more pixels than the subset of pixels;
generating a third depth map using raw pixel values of the high-spatial resolution frame; and
determining a gesture performed by the object, the gesture being determined based high-spatial resolution frame data.

* * * * *